United States Patent
Ulrich et al.

(10) Patent No.: US 7,897,302 B2
(45) Date of Patent: *Mar. 1, 2011

(54) ERROR DIFFUSION-DERIVED SUB-RESOLUTIONAL GRAYSCALE RETICLE

(75) Inventors: Bruce D. Ulrich, Beaverton, OR (US); Yoshi Ono, Camas, WA (US); Wei Gao, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 199 days.

This patent is subject to a terminal disclaimer.

(21) Appl. No.: 12/247,130

(22) Filed: Oct. 7, 2008

(65) Prior Publication Data

US 2010/0040959 A1    Feb. 18, 2010

Related U.S. Application Data

(63) Continuation-in-part of application No. 12/193,568, filed on Aug. 18, 2008.

(51) Int. Cl.
G03F 1/00 (2006.01)
G06F 17/50 (2006.01)

(52) U.S. Cl. .............................. 430/5; 716/19

(58) Field of Classification Search ...... 430/5, 311–313; 382/144; 716/19
See application file for complete search history.

(56) References Cited

U.S. PATENT DOCUMENTS

| 5,821,013 A * | 10/1998 | Miller et al. .......... 430/5 |
| 2006/0200790 A1* | 9/2006 | Shang et al. .......... 716/19 |
| 2006/0210891 A1* | 9/2006 | Progler et al. .......... 430/5 |
| 2010/0040958 A1* | 2/2010 | Ulrich et al. .......... 430/5 |

OTHER PUBLICATIONS

Victor Ostromoukhov, "A Simple and Efficient Error-Diffusion Algorithm", SIGGRAPH 2001.

* cited by examiner

*Primary Examiner* — Stephen Rosasco
*Assistant Examiner* — Stewart A Fraser
(74) *Attorney, Agent, or Firm* — Law Office of Gerald Maliszewski; Gerald Maliszewski

(57) ABSTRACT

A method is provided for forming an error diffusion-derived sub-resolutional grayscale reticle. The method forms at least one partial-light transmissive layer overlying a transparent substrate. At least one unit cell in formed in the transmissive layer. The unit cell is formed by selecting the number of reduced-transmission pixels in the unit cell, and forming a sub-pattern of reduced-transmission pixels in the unit cell. The unit cell is sub-resolutional at a first wavelength.

21 Claims, 8 Drawing Sheets

US 7,897,302 B2

ERROR DIFFUSION-DERIVED SUB-RESOLUTIONAL GRAYSCALE RETICLE

RELATED APPLICATIONS

This application is a Continuation-in-part of a pending application entitled, SUB-RESOLUTIONAL GRAYSCALE RETICLE, invented by Bruce Ulrich et al., Ser. No. 12/193,568, filed Aug. 18, 2008, and is incorporated herein be reference.

BACKGROUND OF THE INVENTION

1. Field of the Invention

This invention generally relates to integrated circuit fabrication and, more particularly, to an imaging reticle employing a combination of grayscale and error diffusion-derived sub-resolutional features.

2. Description of the Related Art

It has proven difficult to form a smooth slope in photoresist over a long distance, at a low angle. Conventional lithography, using a binary pattern of fully opaque and fully transparent regions, can only crudely do the job. This form of lithography produces a sloped transmission change in discrete steps. Light transmission is also modified by the diffractive nature of the light and its unresolved capture through the imaging system (diffraction limited regime). Sub-resolutional patterns are used in this regime. The main problem in producing a smooth sloped photoresist profile is the lateral dimension. If the lateral dimension is too large, greater than say 100 microns, then the change possible due to resolutional patterning is less than the full lateral dimension. This is due to a discrete increment in the patterning.

Grayscale technology has inherent characteristics that lend themselves to a gradual change in transmission from dark to light, which can be used to address the problem of producing a smooth slope of photoresist. Canyon Materials, Inc. is a company that makes grayscale reticles by use of an E-Beam tool and a High Energy e-Beam Sensitive (HEBS) film that changes the transmission of light with a corresponding dose of electrons from the E-Beam tool. The problem with this approach is that the cost of a reticle is high.

FIG. 1 is a diagram depicting a multilevel grayscale mask and a resulting photoresist pattern (prior art). Conventionally, a slope is formed in photoresist by layering grayscale material. The film thickness (FT) is proportional to the dose of light incident on the film. In this case the film is a positive acting photoresist ("whatever shows goes"). Points A, B, C, D, and E are cardinal points representing unpatterned layers of Ti, in this case there are 4, 3, 2, 1, or no layers of Ti. Thus, dose A forms a photoresist (PR) thickness as a result of being attenuated by grayscale layers L(1), L(2), L(3), and L(4). Dose D forms a lesser PR thickness since light only passes through layer L(1) of the reticle. Although the layered approach is cheaper than using an E-beam tool, the multiple process steps required to fabricate such a reticle are complicated. Further, unless an impractical number of thin layers are used, the slope formed by such a reticle in the PR is not gradual, but rather, consists of relatively large discrete steps (as shown).

To realize a binary photomask capable of forming smooth photoresist slopes, complicated software routines and large data file sizes are required. However, the size of data files used in mask fabrication write operations is limited, and any special handling such as piece-wise patterning adds substantially to the cost.

It would be advantageous if there was a cost-effective way of fabricating a grayscale reticle capable of forming gradual slopes in PR, at a low angle.

SUMMARY OF THE INVENTION

The grayscale mask technique disclosed herein uses multiple layers of a thin semi-transparent metal, where individual layers possess a fraction of the sub-resolutional error diffusion features that would be required in an equivalent binary mask. The grayscale mask relies upon thin semi-transparent films, sub-resolutional features, and error diffusion.

The reticle produces discrete changes in the transmission of incident light using corresponding changes in film thickness. The second aspect of the design is the "fine tuning" of light transmission by sub-resolutional patterns similar to conventional binary lithography, except that the pattern's film is not fully opaque. More explicitly, the sub-resolutional patterns are made using an error diffusion (ED) technique. Multiple thicknesses of film span an overall range of transmittances in discrete steps, while sub-resolutional patterning may be used within each film layer to create finer levels of graduation between discrete steps. Essentially, a smooth slope is created as a combination of major steps and minor steps.

Error diffusion (ED) technology was developed many years ago with the advent of dot matrix black and white printers. As applied to the dot matrix printers, ED is used to make printed features appear as levels of gray to the human eye. The patterns that comprise these gray areas are made of dots that are sub-resolutional to the eye. By arranging these sub-resolutional dots, an image of various levels of gray can be created that range from black (full presence of dots) to white (absence of dots). Alternately stated, the ED technique reduces contrast or diffuses a pattern.

As applied to a grayscale mask, the ED technique used herein is based upon a unit cell of m×n pixels. By using an ED unit cell instead of more conventional ED techniques, the magnitude of error associated with neighboring pixels is reduced. Since the ED unit cells can be defined as subroutines and made scaleable, the data files needed to fabricate a mask can be reduced in size. Further, the ED unit cell is configurable by the user, to balance concerns of data file size and programming time against the gradation detail of the transmission profile.

Accordingly, a method is provided for forming an error diffusion-derived sub-resolutional grayscale reticle. The method forms at least one partial-light transmissive layer overlying a transparent substrate. At least one unit cell in formed in the transmissive layer. The unit cell is formed by selecting a number of reduced-transmission pixels in the unit cell, and forming a sub-pattern of reduced-transmission pixels in the unit cell. The unit cell is sub-resolutional at a first wavelength. In some aspects, creating the unit cell includes selecting the position of the reduced-transmission pixels in the unit cell.

As a result, a first intensity of first wavelength light is transmitted through the transmissive layer region adjacent the pattern, and a second intensity of first wavelength light, greater than the first intensity, through the unit cell. The second intensity of light is responsive to the number of selected pixels in the unit cell.

Additional details of the above-described method and a sub-resolution grayscale reticle are presented below.

DETAILED DESCRIPTION

Figure 2:
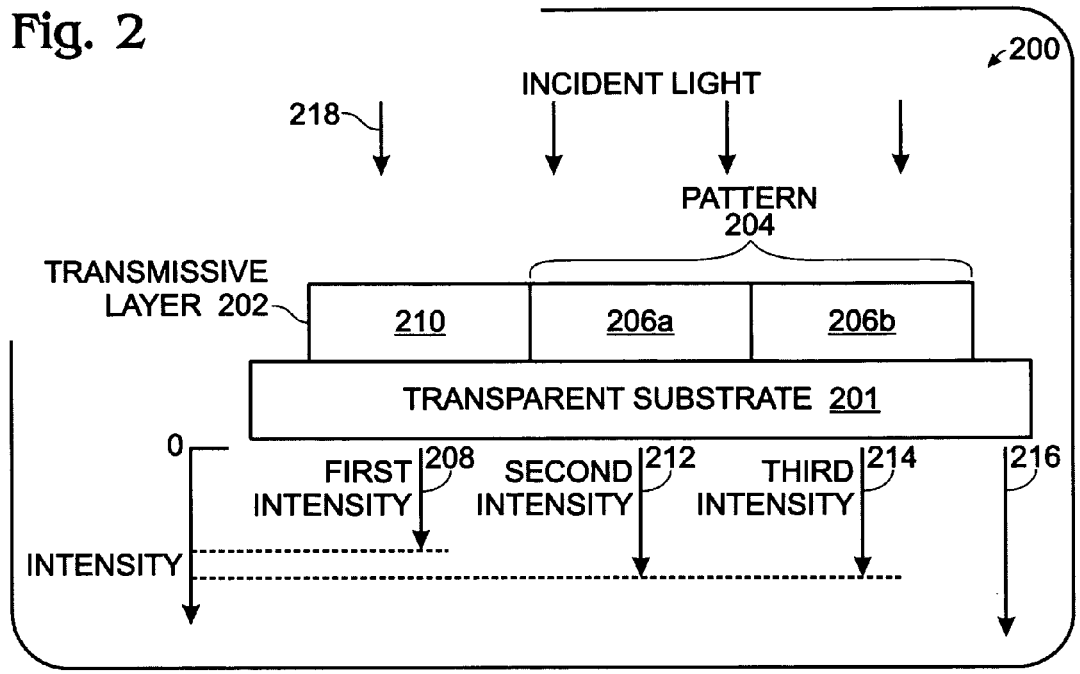
FIG. 2 is a partial cross-sectional view of an error diffusion-derived sub-resolutional grayscale reticle.

FIG. 2 is a partial cross-sectional view of an error diffusion-derived sub-resolutional grayscale reticle. The reticle or mask 200 comprises a transparent substrate 201 and at least one partial-light transmissive layer 202 overlying the transparent substrate. The partial-light transmissive layer 202 partially attenuates incident light. Typically, the degree of attenuation is proportional to the thickness of the layer. For example, the transmissive layer may be made from Ti or $TiO_2$. At least one unit cell 206, with a number of reduced-transmission pixels, is formed in the transmissive layer 202. The unit cell is sub-resolutional at a first wavelength. As shown, a pattern 204 may be formed from a plurality of unit cells, with a number of reduced-transmission pixels in each unit cell. In this example, the pattern includes unit cells 206a and 206b. In some aspects as shown, the unit cells in a pattern are adjacent. In other aspects, not shown, the unit cells of a pattern are separated by regions of unpatterned transmissive layer.

Figure 3:
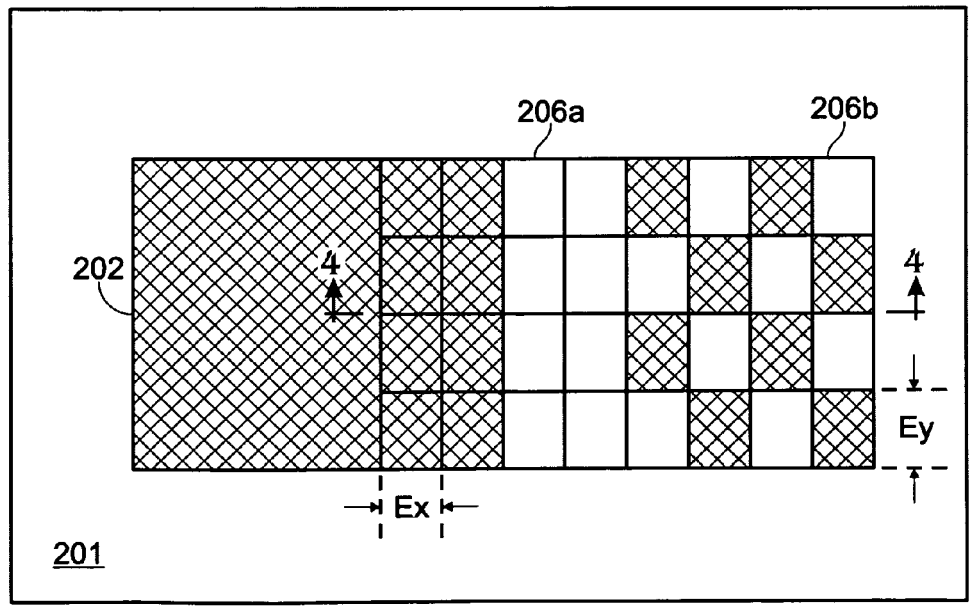
FIG. 3 is a plan view of the pattern depicted in FIG. 2.

FIG. 3 is a plan view of the pattern depicted in FIG. 2. The position of reduced-transmission pixels in the unit cell forms a unit cell sub-pattern. In cell 206a, a sub-pattern of adjacent rectangles is formed. In cell 206b, a checkerboard sub-pattern is formed. The unit cells 206a and 206b each include (m×n) pixels, each pixel having a pixel size of Ex by Ey. In this example, both n and m are equal to 4. However, the unit cell is not limited to any particular values of n and m. Further, the unit cells need not be square (n≠m), Ex need not necessarily be equal to Ey, and units cells need not necessary have a uniform size (number of pixels).

Returning to FIG. 2, the transmissive layer 202 transmits a first intensity of first wavelength light, as represented by reference designator 208, through a transmissive layer region 210 adjacent to the pattern 204, and a second intensity of first wavelength light 212, greater than the first intensity 208, through the unit cell 206a. Generally, the pattern 204 in the transmissive layer transmits first wavelength light at an intensity responsive to the number of non-transmissive pixels in each unit cell. In this example, a third light intensity 214 is transmitted through the second unit cell 206b. Since the number of non-transmissive pixels in the unit cells is the same, the intensities 212 and 214 are equal. Note: the intensity of light 216 through just the transparent substrate 201 is approximately equal in amplitude to the incident light 218.

Figure 4:
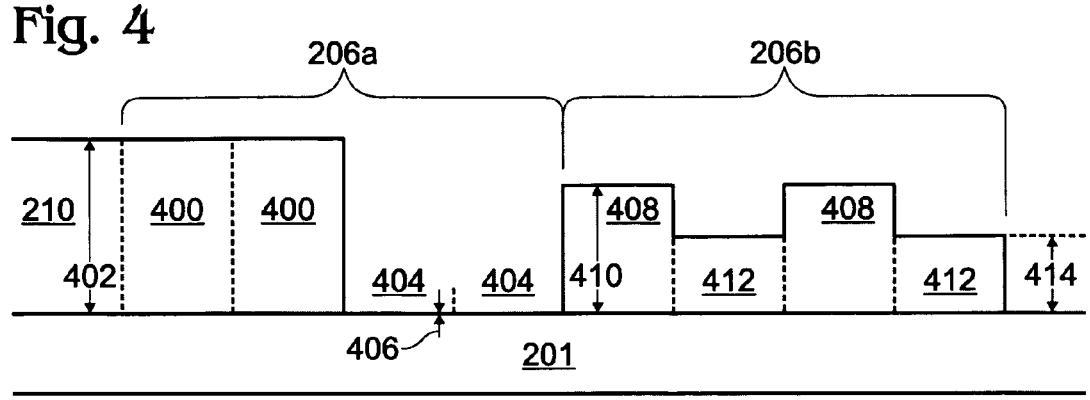
FIG. 4 is a partial cross-sectional detailed view of the unit cells depicted in FIGS. 2 and 3.

FIG. 4 is a partial cross-sectional detailed view of the unit cells depicted in FIGS. 2 and 3. Unit cell 206a includes reduced-transmission pixels 400 having a first thickness 402 in the transmissive layer 202, and transmission pixels 404 having a second thickness 406 in the transmissive layer 202, less than the first thickness 402. Likewise, unit cell 206b includes reduced-transmission pixels 408 having a first thickness 410 in the transmissive layer 202, and transmission pixels 412 having a second thickness 414 in the transmissive layer 202, less than the first thickness 410. As shown, the first thickness of unit cell 206a need not be equal to the first thickness in unit cell 206b. Likewise, the second thicknesses of the two unit cells need not necessarily be the same. However, in other aspects not shown, the first thickness of unit cells are equal, and the second thickness of unit cells are equal.

As shown, the first thickness 402 is about 100% of a transmissive layer thickness, contrasted with a second thickness 406 of about a 0% of the transmissive layer thickness. First thickness 410 is about 75% of the transmissive layer thickness, while second thickness 414 is about 25%. In another aspect not shown, the unit cell is formed by contrasting three or more transmissive layer thicknesses. It should be remembered that the percentage of light attenuated by the unit cell is not necessarily directly proportional to the percentage of first thickness left in the pattern, since the transmissive layer, even at full thickness, is not totally opaque. Further, since the unit cell is sub-resolution, light transmitted through the unit cell is partially transmitted to regions adjoining, but not underlying the unit cell.

Thus, each unit cell transmits first wavelength light at an intensity responsive to the number of non-transmissive pixels 400/408, the transmissive layer first thickness 402/410, and the transmissive layer second thickness 406/414.

Figure 5A:
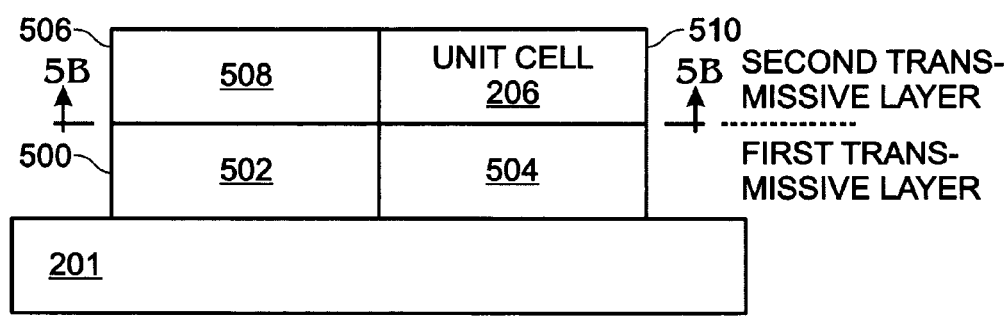
FIGS. 5A and 5B are partial cross-sectional and plan views, respectively, of another exemplary error diffusion-derived sub-resolutional grayscale reticle.
Figure 5B:
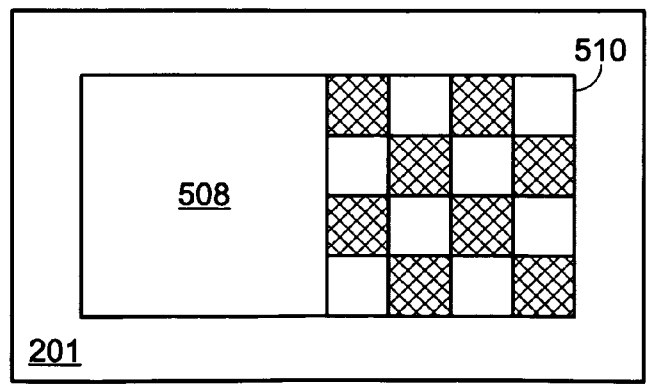

FIGS. 5A and 5B are partial cross-sectional and plan views, respectively, of another exemplary error diffusion-derived sub-resolutional grayscale reticle. A first transmissive layer 500 has a first section 502 and second section 504. A second transmissive layer 506 has a first section 508 overlying the first section 502 of the first transmissive layer 500, and a second section 510 overlying the second section 504 of the first transmissive layer 500. A unit cell 206, as defined above, is formed in the second section 510 of the second transmissive layer 506.

Even if the extinction coefficients of the transmissive layers 500 and 506 are the same, the transmission characteristics (attenuation) of layers can be made different by using different thicknesses. In another aspect, transmissive layer 500 has a first extinction coefficient (k) or absorption rate, and transmissive layer 506 has a second extinction coefficient, different than the first extinction coefficient.

$I=I_O e^{-kd}$ where I is light transmitted through the reticle;
$I_O$ is light incident to the reticle; and,
d is the thickness of a transmissive layer.

Note: the use of two layers and two adjacent unit cells with graded light transmission characteristics does not necessarily create a perfectly linear change in transmitted light intensity. However, the use of two patterns in a transmissive layer permits the larger discrete step (associated with -the greater extinction coefficient) to be broken into two sub-steps. Even greater variations can be created through the reticle if the transmissive layers have different thicknesses.

Functional Description

Conventional reticles are usually made of a glass or quartz substrate with an overlying Cr/CrO layer patterned and fully etched, yielding a "binary" reticle that has two levels of transmission, either fully transparent or fully opaque. Using grayscale lithography, reticles of varying transmissions can be fabricated that are dependent upon the thickness of the attenuating film used. Combining both binary and grayscale lithographies, a reticle can be made to produce smooth ramps of photoresist. For example, a pyramid with a smooth slope can be made. Another aspect of the invention is that the lateral length of the ramp can be made larger in dimension with a higher degree of control than that of the conventional binary reticle.

Patterned layers are layers that have unit cell sub-patterns etched though the layer. The unit cells, and therefore the pattern, is not resolved in the exposed image and thus works like a water valve in a pipe, where the amount of water passing through the pipe is a function of the position of the valve. Thus, the amount of light that gets though the optical system is a function of the pattern shape.

Figure 6:
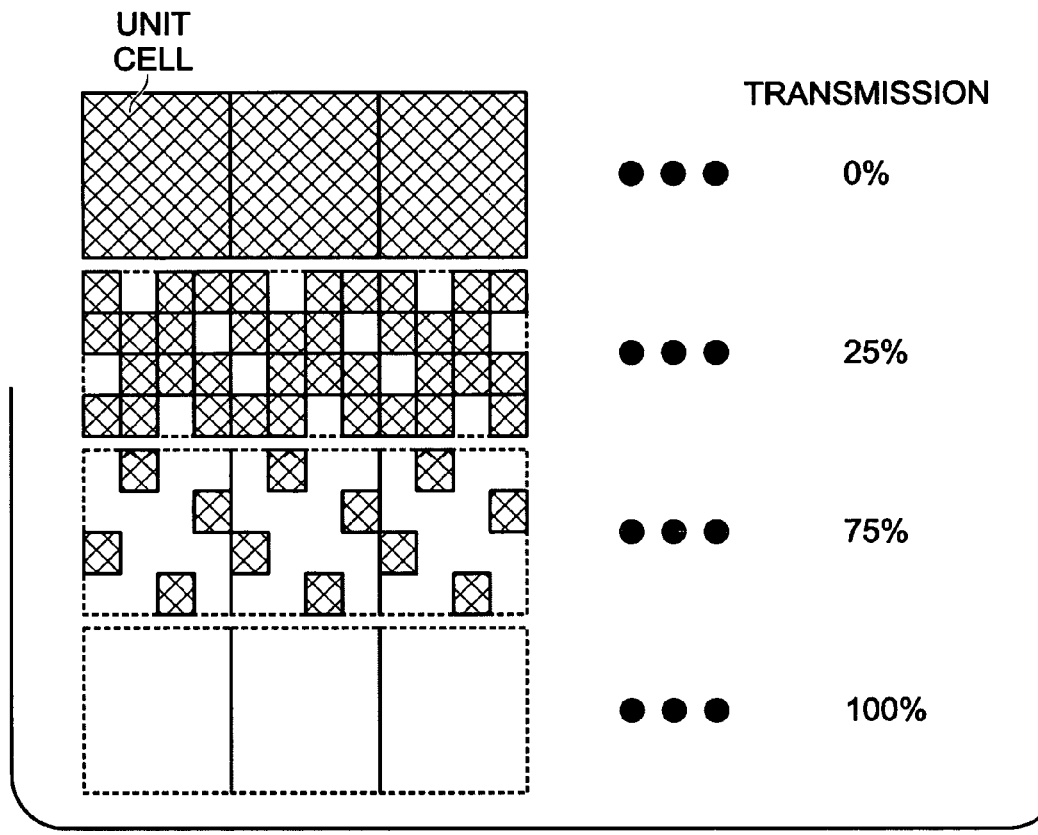
FIG. 6 is a plan view illustrating four unit cells with different sub-patterns, etched into a single layer.

FIG. 6 is a plan view illustrating four unit cells with different sub-patterns, etched into a single layer. Each pattern has a different transmission value.

Figure 1:
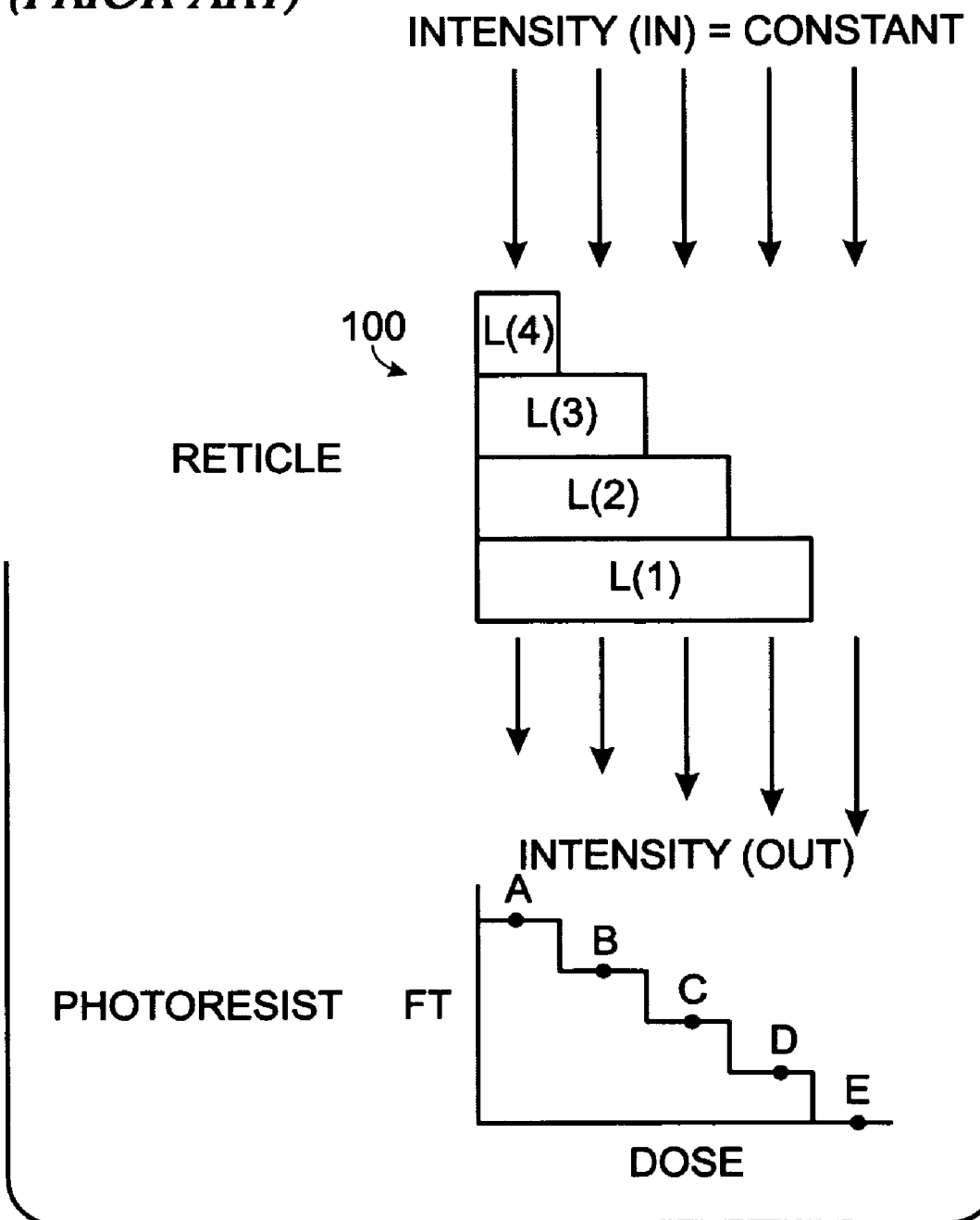
FIG. 1 is a diagram depicting a multilevel grayscale mask and a resulting photoresist pattern (prior art).
Figure 7:
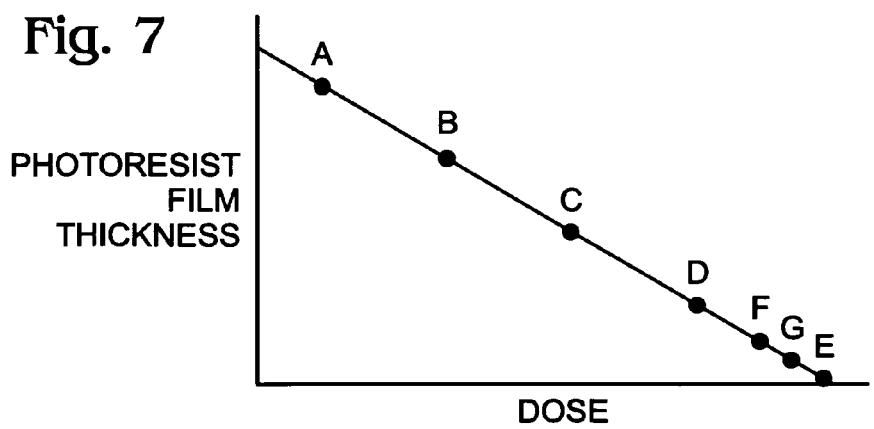
FIG. 7 is a plot of dose vs. photoresist film thickness.

FIG. 7 is a plot of dose vs. photoresist film thickness. "Dose" is the accumulated energy from an exposure of light at a given intensity. The prior art grayscale lithography depicted in FIG. 1 can be used to set the film thickness between any adjacent cardinal point by the use of the binary patterning on one of the Ti layers. Referring to FIG. 1, points between D and E can be realized by using a unit cell patterned and etched layer of Ti, as shown in FIG. 7. By using a 25% and a 75% unit cells, points F and G can be formed in the resultant film thickness.

Figure 8:
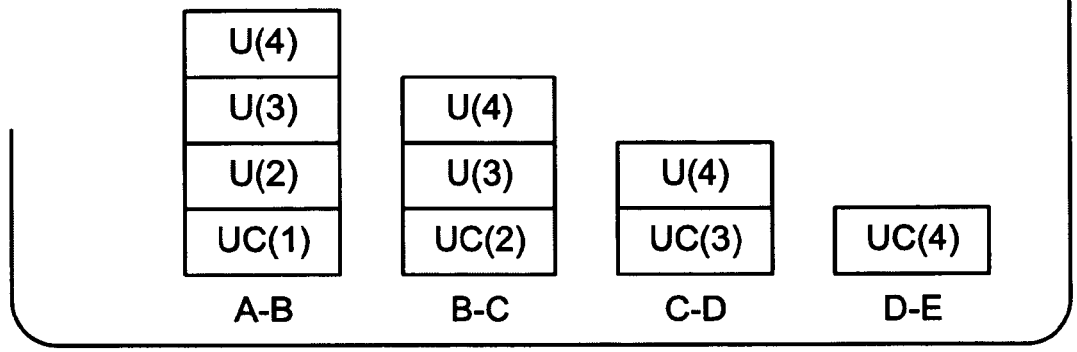
FIG. 8 is a partial cross-sectional drawing depicting a multilevel error diffusion-derived sub-resolutional grayscale reticle.

FIG. 8 is a partial cross-sectional drawing depicting a multilevel error diffusion-derived sub-resolutional grayscale reticle. Intermediate points between the cardinal points (A, B, C, D, and E, see FIG. 1) can be realized. A film stack with a varying number of Ti layers is shown where the bottom layer is the patterned and etched, forming unit cell 1, unit cell 2, unit cell 3, and unit cell 4. The unpatterned layer is denoted by the letter U for unpatterned layer.

Figure 9:
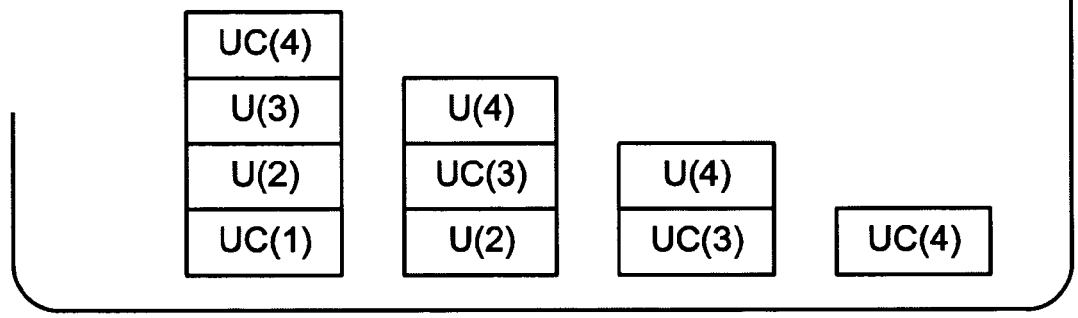
FIG. 9 depicts an alternative to the multilevel error diffusion-derived sub-resolutional grayscale reticle of FIG. 8.

FIG. 9 depicts an alternative to the multilevel error diffusion-derived sub-resolutional grayscale reticle of FIG. 8. The unit cells are formed at different layers of the film stack.

Figure 10:
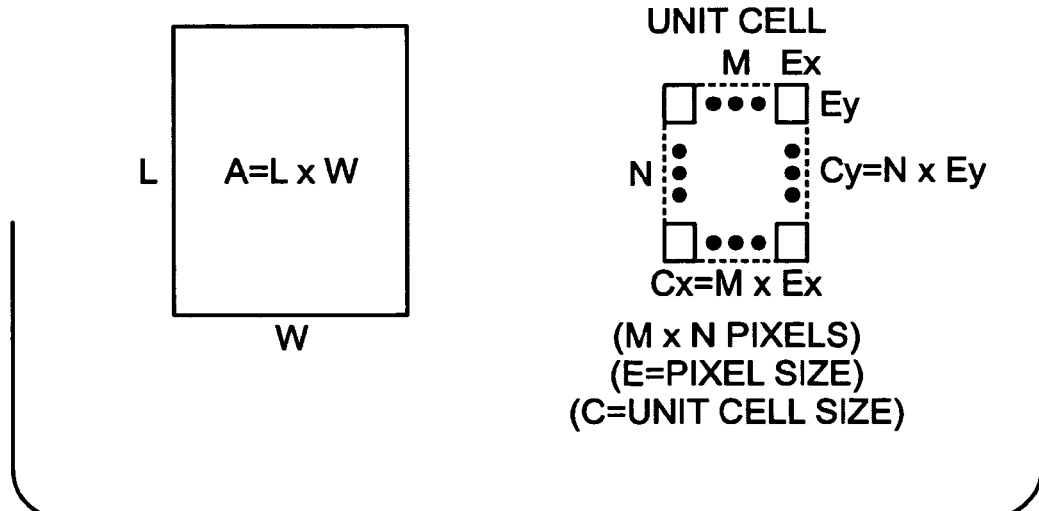
FIG. 10 is a diagram illustrating the unit cell metrics.

FIG. 10 is a diagram illustrating the unit cell metrics. Given an area A with the dimensions of L×W, a unit cell of m x n pixels can be created. Each pixel has the dimensions of Ex and Ey. The x dimension of the unit cell is Cx=m×Ex and the y dimensions is Cy=n×Ey.

Over the area A, the range of light intensities may vary between 0 and 1. The minimum increment of intensity is defined as Incr=1/(m×n). The intensity values are therefore: 0, Incr, 2*Incr, 3*Incr, . . . , 1. and the total number of possibilities are (M×N)+1.) The error between the old and new intensity values is diffused among the neighboring pixels.

Figure 11:
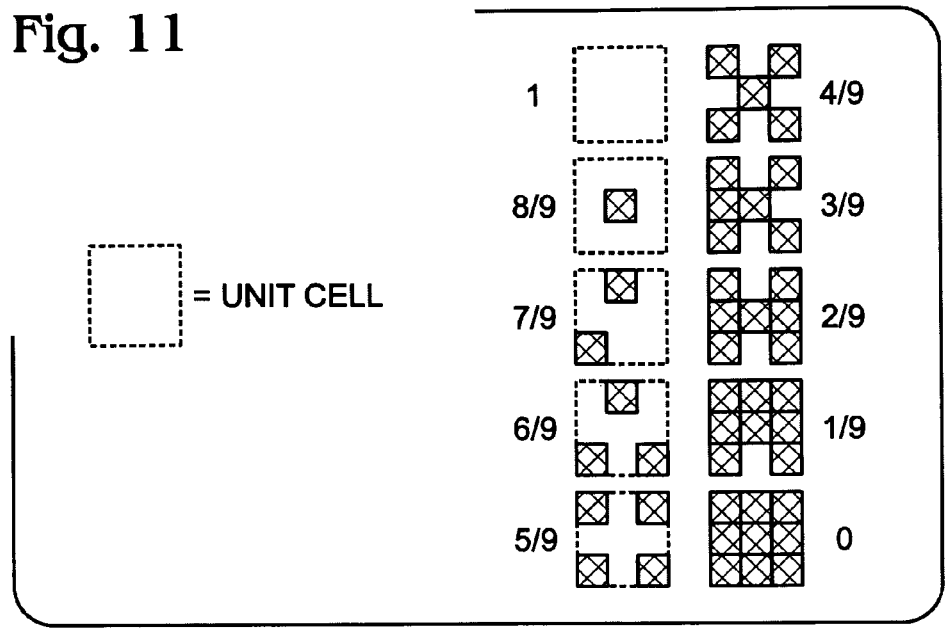
FIG. 11 is a diagram depicting all the possible variations of a 9-pixel (3×3) unit cell.

FIG. 11 is a diagram depicting all the possible variations of a 9-pixel (3×3) unit cell. In the simple case, each pixel of the unit cell can either be fully opaque or fully transparent within a particular grayscale layer. This gives rise to a number of combinations of pixel patterns.

Given an area A of L=1000 um and W=2000 um, a unit cell of 16 total pixels can be created having 4 pixels on each side (m=n=4). The pixel width and length are both 0.5 um (Ex=Ey=0.5 um). The unit cell dimension is calculated to be Cx=m×Ex=4×0.5 um=2 um on the x side and Cy=n×Ey=4× 0.5 um=2 um on the y side. The minimum increment of intensity is Incr=1/(m×n)=1/(4×4)=0.0625 and the total number of possible intensity values are (m×n)+1=17 values according to the following pattern: 0, 0.0625, 0.125, 0.1875, . . . , 0.875, 0.9375, 1.

In conventional binary lithography a large feature can be used to block all of the incoming light, whereas in grayscale lithography a minimum transmission can be achieved by adjusting the thickness of the semi-transparent layers. Error diffusion techniques are, therefore, more effectively applied to grayscale lithography, especially when the photoresist resultant film thickness changes significantly in response to small changes in dose, as is the case with dyed photoresist (PR).

Figure 12:
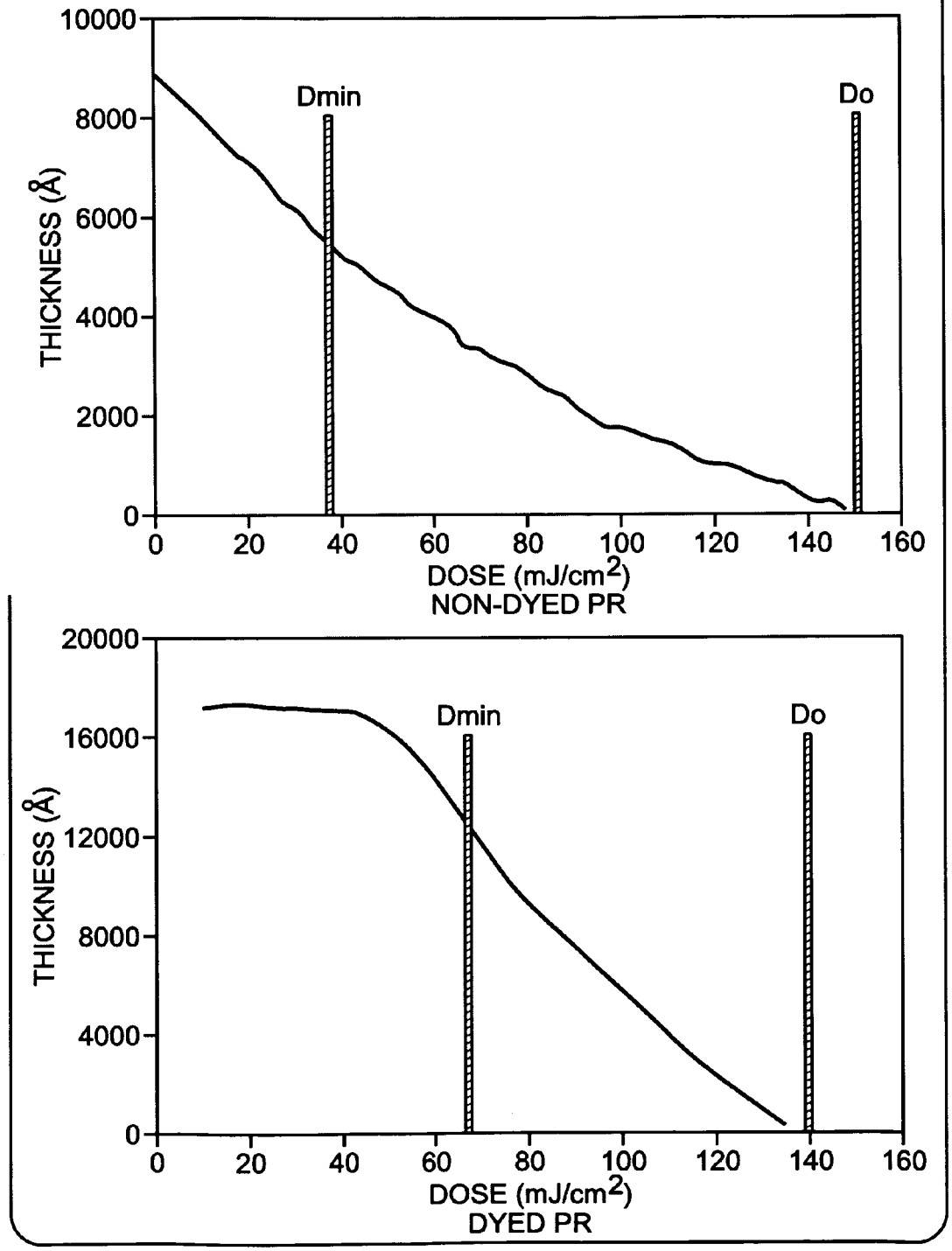
FIG. 12 shows graphs comparing light dosage against resultant photoresist film thickness for dyed and non-dyed photoresist.

FIG. 12 shows graphs comparing light dosage against resultant photoresist film thickness for dyed and non-dyed photoresist. The photoresist response curves are quite different. Especially note in the dyed case there is a threshold dose at the knee of the curve. When a higher dose is applied, the thickness follows a different steeper path. This limits the scope of ED patterning in conventional lithography. Another limiting factor is the operating dose that can be used effectively with conventional lithography.

Figure 13:
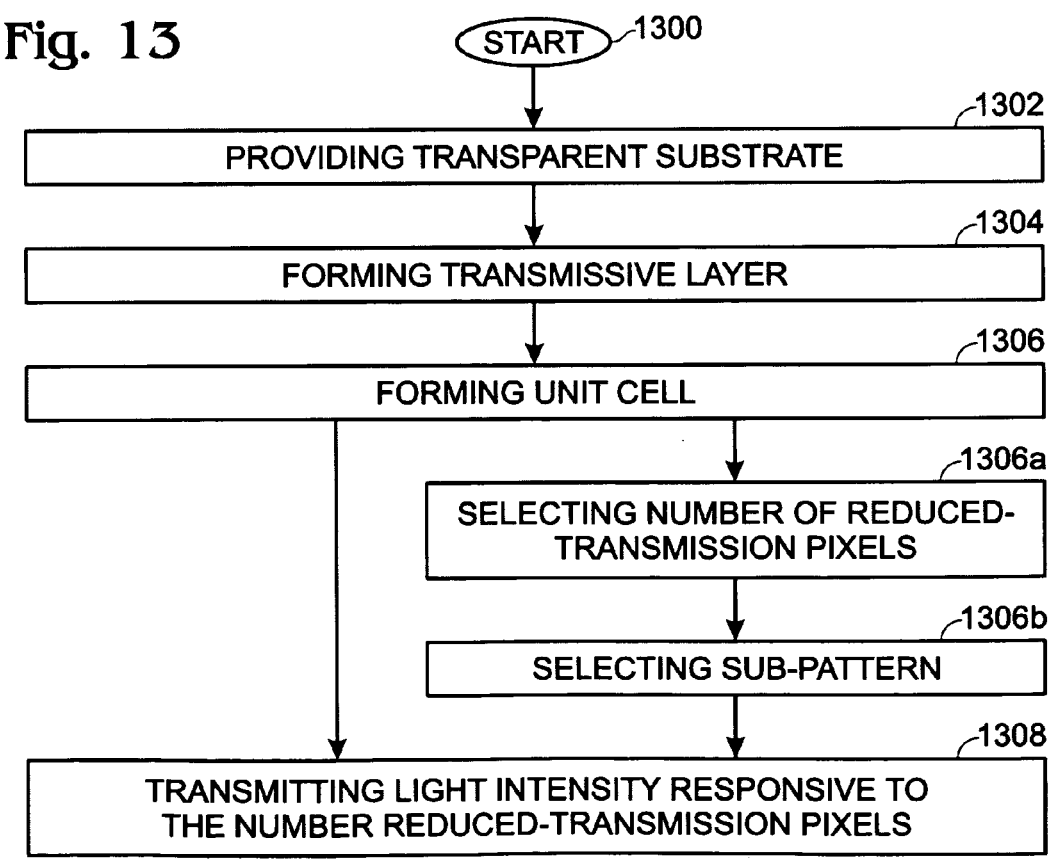
FIG. 13 is a flowchart illustrating a method for forming an error diffusion-derived sub-resolutional grayscale reticle.

FIG. 13 is a flowchart illustrating a method for forming an error diffusion-derived sub-resolutional grayscale reticle. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1300.

Step 1302 provides a transparent substrate. Step 1304 forms at least one partial-light transmissive layer overlying the transparent substrate. Step 1306 forms at least one unit cell, sub-resolutional at a first wavelength with substeps. Step 1306a selects a number of reduced-transmission pixels in the unit cell. For example, at least one reduced-transmission pixel is selected, having a pixel size of Ex by Ey, in a unit cell of (m×n) pixels. Step 1306b forms a sub-pattern of reduced-transmission pixels in the unit cell. In one aspect, Step 1306 selects the position of the reduced-transmission pixels in the unit cell. In another aspect, Step 1306 creates a pattern in the transmissive layer by selecting a plurality of unit cells, and selecting the number of reduced-transmission pixels in each unit cell.

Step 1308 transmits a first intensity of first wavelength light through the transmissive layer region adjacent the unit cell, and a second intensity of first wavelength light, greater than the first intensity, through the unit cell. The second intensity is responsive to the number of reduced-transmission pixels in the unit cell.

In a different aspect, Step 1304 forms a first transmissive layer with first and second sections. Step 1304 also forms a second transmissive layer having a first section overlying the first section of the first transmissive layer, and a second section overlying the second section of the first transmissive layer. Then, forming the unit cell in Step 1306 includes forming the unit cell in the second section of the second transmissive layer.

In one aspect, forming the unit cell in Step 1306 includes selecting reduced-transmission pixels having a first thickness in the transmissive layer, in contrast with unselected transmission pixels having a second thickness in the transmissive layer, less than the first thickness. Then, Step 1308 transmits first wavelength light through the unit cell at an intensity responsive to the number of selected reduced-transmission pixels, the transmissive layer first thickness, and the transmissive layer second thickness.

Figure 14:
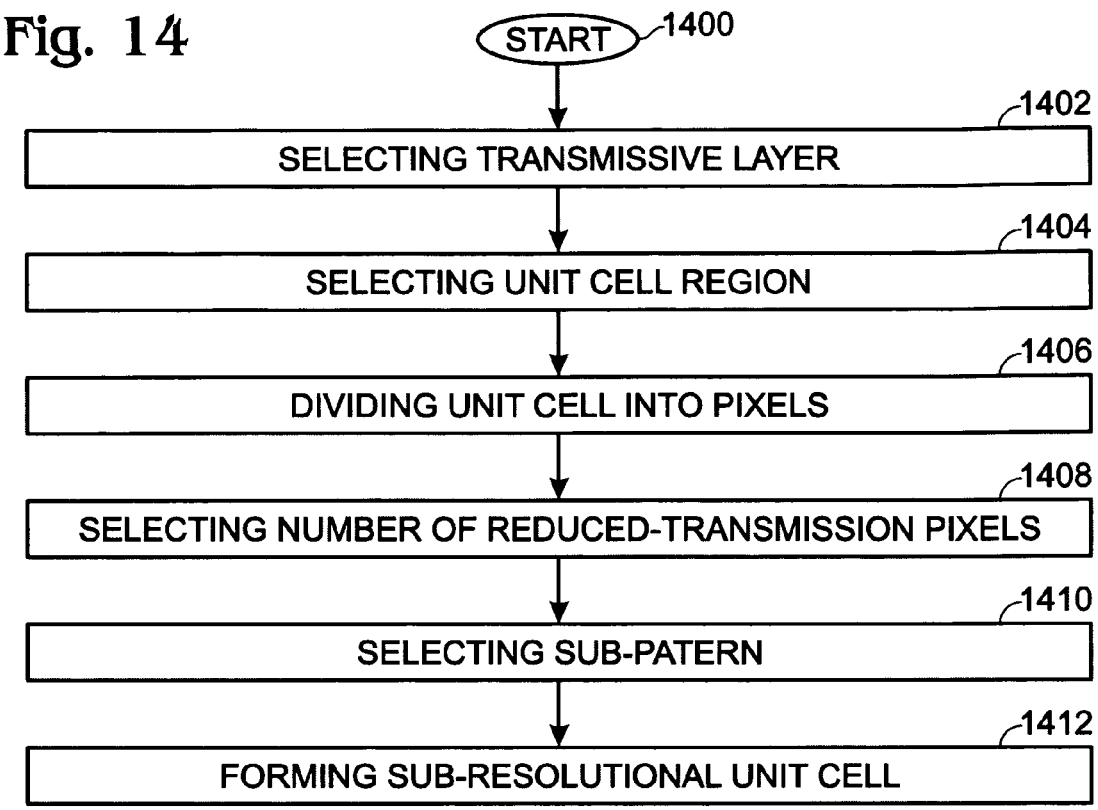
FIG. 14 is a flowchart illustrating instructions for an error diffusion-derived sub-resolutional grayscale reticle as stored in a machine-readable tangible memory medium.

FIG. 14 is a flowchart illustrating instructions for an error diffusion-derived sub-resolutional grayscale reticle as stored in a machine-readable tangible memory medium. The instructions start at Step 1400. Step 1402 selects at least one partial-light transmissive layer overlying a transparent substrate. Step 1404 selects at least one unit cell region in the transmissive layer. Step 1406 divides the unit cell into a plurality of pixels. Step 1408 selects a number of reduced-transmission pixels. Step 1410 selects a sub-pattern of reduced-transmission pixels. Step 1412 forms a unit cell that is sub-resolutional at a first wavelength of light.

The instructions of FIG. 14 may be enabled as software instructions in a program application stored in memory, and accessed and executed by a processor. The data file of the resultant reticle design may be stored as a data file in memory. The data file, in turn, may be used as instructions, or as variables in a processor-executed application to control the machinery used to fabricate (i.e. pattern and etch) a reticle.

An error diffusion-derived sub-resolutional grayscale reticle and associated fabrication processes have been provided. Examples of materials, unit cell designs, and light intensity doses have been presented to illustrate the invention. However, the invention is not limited to merely these examples. Other variations and embodiments of the invention will occur to those skilled in the art.

We claim:

1. A method for forming an error diffusion-derived sub-resolutional grayscale reticle, the method comprising:
    providing a transparent substrate;
    forming a first partial-light transmissive layer overlying the transparent substrate;
    forming a second partial-light transmissive layer overlying the first transmissive layer and,
    forming a first unit cell in the first transmissive layer, sub-resolutional at a first wavelength;
    forming a second unit cell in the second transmissive layer, sub-resolutional at the first wavelength, overlying at least a portion of the first unit cell;
    wherein forming the first and second unit cells includes forming each unit cell as follows:
        selecting a number of reduced-transmission pixels in the unit cell; and,
        forming a sub-pattern of reduced-transmission pixels in the unit cell.

2. The method of claim 1 wherein forming each unit cell includes selecting the position of the reduced-transmission pixels in the unit cell.

3. The method of claim 1 wherein forming each unit cell includes creating a pattern in the corresponding transmissive layer by selecting a plurality of unit cells.

4. The method of claim 1 wherein selecting the number of pixels in each unit cell includes selecting at least one reduced-transmission pixel, having a pixel size of Ex by Ey, in a unit cell of (m x n) pixels.

5. The method of claim 1 further comprising:
    transmitting a first intensity of first wavelength light through a first transmissive layer region adjacent the first unit cell, and a second intensity of first wavelength light, greater than the first intensity, through the first unit cell; and,
    transmitting a third intensity of first wavelength light through a second transmissive layer region adjacent the second unit cell, and a fourth intensity of first wavelength light, greater than the third intensity, through the second unit cell.

6. The method of claim 5 wherein transmitting the second intensity of light through the first unit cell includes transmitting first wavelength light through the first unit cell at an intensity responsive to the number of reduced-transmission pixels in the unit cell.

7. The method of claim 1 wherein forming the first and second transmissive layers includes forming the first transmissive layer with first and second sections, and the second transmissive layer having a first section overlying the first section of the first transmissive layer, and a second section overlying the second section of the first transmissive layer;
    wherein forming the first unit cell includes forming the first unit cell in the second section of the first transmissive layer; and,
    wherein forming the second unit cell includes forming the second unit cell in the second section of the second transmissive layer.

8. The method of claim 1 wherein forming the first unit cell includes selecting reduced-transmission pixels having a first thickness in the first transmissive layer, in contrast with unselected transmission pixels having a second thickness in the first transmissive layer, less than the first thickness.

9. The method of claim 8 further comprising:
    transmitting first wavelength light through the first unit cell at an intensity responsive to the number of selected reduced-transmission pixels, the first transmissive layer first thickness, and the first transmissive layer second thickness.

10. An error diffusion-derived sub-resolutional grayscale reticle, the reticle comprising:
    a transparent substrate;
    a first partial-light transmissive layer overlying the transparent substrate;
    a second partial-light transmissive layer overlying the first transmissive layer;
    a first unit cell, with a number of reduced-transmission pixels, that is sub-resolutional at a first wavelength, formed in the first transmissive layer; and,
    a second unit cell, with a number of reduced-transmission pixels, that is sub-resolutional at the first wavelength, formed in the second transmissive layer overlying the first unit cell.

11. The reticle of claim 10 wherein the position of reduced-transmission pixels in each unit cell forms a unit cell sub-pattern.

12. The reticle of claim 10 further comprising:
    a plurality of unit cells in the second transmissive layer, each forming a pattern, with a number of reduced-transmission pixels in each unit cell.

13. The reticle of claim 10 wherein each unit cell includes (m x n) pixels, each pixel having a pixel size of Ex by Ey.

14. The reticle of claim 10 wherein the first transmissive layer transmits a first intensity of first wavelength light through a first transmissive layer region adjacent the first unit cell, and a second intensity of first wavelength light, greater than the first intensity, through the first unit cell; and,
    wherein the second transmissive layer transmits a third intensity of first wavelength light through a second transmissive layer region adjacent the second unit cell, and a fourth intensity of first wavelength light, greater than the third intensity, through the second unit cell.

15. The reticle of claim 14 wherein the first unit cell transmits first wavelength light at an intensity responsive to the number of reduced-transmission pixels in the first unit cell.

16. The reticle of claim 10 wherein the first transmissive layer includes first and second sections, and the second transmissive layer has a first section overlying the first section of the first transmissive layer, and a second section overlying the second section of the first transmissive layer;

wherein the first unit cell is formed in the second section of the first transmissive layer; and, wherein the second unit cell is formed in the second section of the second transmissive layer.

17. The reticle of claim 10 wherein the first unit cell includes reduced-transmission pixels having a first thickness in the first transmissive layer, and transmission pixels having a second thickness in the first transmissive layer, less than the first thickness.

18. The reticle of claim 17 wherein the first unit cell transmits first wavelength light at an intensity responsive to the number of non-transmissive pixels, the first transmissive layer first thickness, and the first transmissive layer second thickness.

19. A machine-readable non-transitory memory medium having stored thereon instructions for an error diffusion-derived sub-resolutional grayscale reticle, the instructions comprising:

selecting a partial-light transmissive layer overlying a transparent substrate;

selecting a first unit cell region in the first transmissive layer;

dividing the first unit cell into a plurality of pixels;

selecting a number of reduced-transmission pixels;

selecting a sub-pattern of reduced-transmission pixels;

in response to the pixel sub-pattern, forming the first unit cell sub-resolutional at a first wavelength of light;

selecting a second partial-light transmissive layer overlying the first transmissive layer;

selecting a second unit cell region in the second transmissive layer overlying the first unit cell;

dividing the second unit cell into a plurality of pixels;

selecting a number of reduced-transmission pixels;

selecting a sub-pattern of reduced-transmission pixels; and, in response to the pixel sub-pattern, forming the second unit cell sub-resolutional at a first wavelength of light.

20. The method of claim 1 further comprising:

forming a third partial-light transmissive layer interposed between the first and second unit cells.

21. The reticle of claim 10 further comprising:

a third partial-light transmissive layer interposed between the first and second unit cells.

* * * * *

UNITED STATES PATENT AND TRADEMARK OFFICE
CERTIFICATE OF CORRECTION

PATENT NO.         : 7,897,302 B2
APPLICATION NO.    : 12/247130
DATED              : March 1, 2011
INVENTOR(S)        : Bruce Ulrich et al.

It is certified that error appears in the above-identified patent and that said Letters Patent is hereby corrected as shown below:

In claim 19, at column 10, line 1, the word "first" is missing between the phrase "selecting a" and "partial-light".

Claim 19 should be printed as follows:

19. A machine-readable non-transitory memory medium having stored thereon instructions for an error diffusion-derived sub-resolutional grayscale reticle, the instructions comprising:
    selecting a first partial-light transmissive layer overlying a transparent substrate;
    selecting a first unit cell region in the first transmissive layer;
    dividing the first unit cell into a plurality of pixels;
    selecting a number of reduced-transmission pixels;
    selecting a sub-pattern of reduced-transmission pixels;
    in response to the pixel sub-pattern, forming the first unit cell sub-resolutional at a first wavelength of light;
    selecting a second partial-light transmissive layer overlying the first transmissive layer;
    selecting a second unit cell region in the second transmissive layer overlying the first unit cell;
    dividing the second unit cell into a plurality of pixels;
    selecting a number of reduced-transmission pixels;
    selecting a sub-pattern of reduced-transmission pixels; and,
    in response to the pixel sub-pattern, forming the second unit cell sub-resolutional at a first wavelength of light.

Signed and Sealed this
Twelfth Day of April, 2011

David J. Kappos
*Director of the United States Patent and Trademark Office*